(12) United States Patent
Shang et al.

(10) Patent No.: US 12,315,554 B2
(45) Date of Patent: May 27, 2025

(54) DECODING DRIVE CIRCUIT AND METHOD THEREFOR, WORD LINE DECODING CIRCUIT AND SEMICONDUCTOR MEMORY

(71) Applicant: CHANGXIN MEMORY TECHNOLOGIES, INC., Hefei (CN)

(72) Inventors: Weibing Shang, Hefei (CN); Xianjun Wu, Hefei (CN); Minghao Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 198 days.

(21) Appl. No.: 18/166,378

(22) Filed: Feb. 8, 2023

(65) Prior Publication Data

US 2023/0186970 A1  Jun. 15, 2023

Related U.S. Application Data

(63) Continuation of application No. PCT/CN2022/099547, filed on Jun. 17, 2022.

(30) Foreign Application Priority Data

Aug. 24, 2021 (CN) .......................... 202110972631.X

(51) Int. Cl.
*G11C 11/408* (2006.01)
(52) U.S. Cl.
CPC ...... *G11C 11/4085* (2013.01); *G11C 11/4087* (2013.01)
(58) Field of Classification Search
CPC .......................... G11C 11/4085; G11C 11/408

USPC ...................................................... 365/230.06
See application file for complete search history.

(56) References Cited

U.S. PATENT DOCUMENTS

| 6,160,747 | A | 12/2000 | Brox |
| 7,227,799 | B2 | 6/2007 | Vogelsang |
| 7,349,287 | B2 | 3/2008 | Murata |
| 2001/0015666 | A1* | 8/2001 | Noda ............... G11C 7/222 327/277 |

(Continued)

FOREIGN PATENT DOCUMENTS

| CN | 1992073 A | 7/2007 |
| CN | 101047022 A | 10/2007 |

(Continued)

OTHER PUBLICATIONS

Extended European search report in application No. 22860018, mailed on Aug. 26, 2024.

*Primary Examiner* — Muna A Techane
(74) *Attorney, Agent, or Firm* — Syncoda LLC; Feng Ma

(57) ABSTRACT

A decoding drive circuit includes at least one decoding driver. The decoding driver includes a first-stage drive circuit and a second-stage drive circuit. Herein, the first-stage drive circuit is configured to receive an enabling control signal, a decoding input signal and a drive control signal, and generate a first drive signal and a second drive signal according to the enabling control signal, the drive control signal and the decoding input signal. The second-stage drive circuit is configured to generate a target word line drive signal according to the first drive signal and the second drive signal. Thus, the embodiments of the disclosure provide a new decoding drive circuit.

15 Claims, 13 Drawing Sheets

(56) References Cited

U.S. PATENT DOCUMENTS

| | | | |
|---|---|---|---|
| 2002/0024873 A1* | 2/2002 | Tomishima | G11C 11/4087 |
| | | | 365/230.06 |
| 2007/0147163 A1 | 6/2007 | Murata | |
| 2009/0238012 A1* | 9/2009 | Tatapudi | G11C 5/063 |
| | | | 326/29 |
| 2017/0206941 A1* | 7/2017 | Po | H10B 41/60 |
| 2020/0349999 A1 | 11/2020 | Kawamura et al. | |
| 2021/0407586 A1 | 12/2021 | Li | |

FOREIGN PATENT DOCUMENTS

| | | |
|---|---|---|
| CN | 109754834 A | 5/2019 |
| CN | 111863068 A | 10/2020 |
| JP | 2001202778 A | 7/2001 |

* cited by examiner

DECODING DRIVE CIRCUIT AND METHOD THEREFOR, WORD LINE DECODING CIRCUIT AND SEMICONDUCTOR MEMORY

CROSS-REFERENCE TO RELATED APPLICATIONS

This is a continuation of International Patent Application No. PCT/CN2022/099547 filed on Jun. 17, 2022, which claims priority to Chinese Patent Application No. 202110972631.X filed on Aug. 24, 2021. The disclosures of the above-referenced applications are hereby incorporated by reference in their entirety.

BACKGROUND

A Dynamic Random Access Memory (DRAM) is a commonly used semiconductor memory device in computers, and is composed of a number of repeated memory cells. Different memory cells need to be selected via word lines and bit lines. However, the current DRAM is unreasonable in circuit design of related word lines, which leads to the performance of the DRAM to be improved.

SUMMARY

According to a first aspect, embodiments of the present disclosure provide a decoding drive circuit. The decoding drive circuit includes at least one decoding driver, and the decoding driver includes a first-stage drive circuit and a second-stage drive circuit. The first-stage drive circuit is configured to receive an enabling control signal, a decoding input signal and a drive control signal, and generate a first drive signal and a second drive signal according to the enabling control signal, the drive control signal and the decoding input signal. The second-stage drive circuit is configured to generate a target word line drive signal according to the first drive signal and the second drive signal.

According to a second aspect, the embodiments of the present disclosure provide a method for decoding drive, applied to a decoding drive circuit. The decoding drive circuit includes at least one decoding driver, and the decoding driver includes a first-stage drive circuit and a second-stage drive circuit. The method includes the following operations. An enabling control signal, a decoding input signal and a drive control signal are received through a first-stage drive circuit, and a first drive signal and a second drive signal are generated according to the enabling control signal, the drive control signal and the decoding input signal. The first drive signal and the second drive signal are received through a second-stage drive circuit, and a target word line drive signal is generated according to the first drive signal and the second drive signal.

According to a third aspect, the embodiments of the present disclosure provide a word line decoding circuit. The word line decoding circuit includes a word line drive circuit, an inverted main word line drive circuit and a local decoding drive circuit. Herein, the word line drive circuit at least includes a decoding drive circuit. The decoding drive circuit includes at least one decoding driver, the decoding driver comprising a first-stage drive circuit and a second-stage drive circuit. The first-stage drive circuit is configured to receive an enabling control signal, a decoding input signal and a drive control signal, and generate a first drive signal and a second drive signal according to the enabling control signal, the drive control signal and the decoding input signal, the second-stage drive circuit is configured to generate a target word line drive signal according to the first drive signal and the second drive signal.

According to a fourth aspect, the embodiments of the disclosure provide a semiconductor memory. The semiconductor memory includes a word line decoding circuit as in the third aspect.

DETAILED DESCRIPTION

Figure 1:
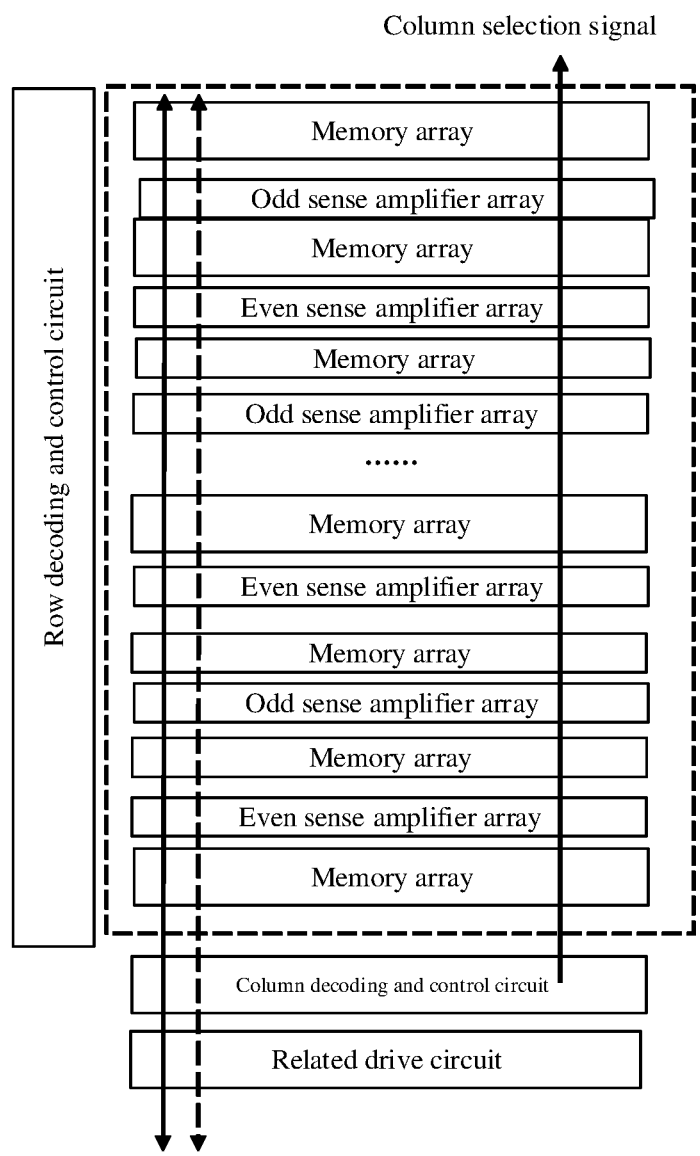
FIG. 1 is a local structural schematic diagram of a DRAM according to an embodiment of the disclosure.

Technical solutions in the embodiments of the disclosure are clearly and completely described below in combination with the drawings in the embodiments of the disclosure. It is to be understood that the specific embodiments described herein are merely illustrative of the disclosure and are not intended to limit the disclosure. In addition, it is also to be noted that, for ease of description, only the parts related to the relevant disclosure are shown in the drawings. Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure. "Some embodiments" involved in the following descriptions describes a subset of all possible embodiments. However, it can be understood that "some embodiments" may be the same subset or different subsets of all the possible embodiments, and may be combined without conflicts. It is to be pointed out that terms "first/second/third" involved in the embodiments of the disclosure are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

A DRAM is a commonly used semiconductor memory device in computers, and is composed of a number of repeated memory cells. Different memory cells need to be selected via word lines and bit lines. However, the current DRAM still has some defects in the circuit design of related word lines.

Referring to FIG. 1, which illustrates a local structural schematic diagram of a DRAM according to an embodiment of the disclosure. As shown in FIG. 1, the core of the DRAM is a memory cell array (or an Array, Array Mat), a Sense Amplifier (SA) array, a row decoding and control circuit (XDEC), a column decoding and control circuit (YDEC), a drive circuit (or an SSA & Write Driver circuit), a data input and output conversion circuit, etc. Herein, one DRAM may include a plurality of memory cell arrays and a plurality of SA arrays. Generally, the SA array may also be divided into an odd SA array and an even SA array.

The memory cell array is composed of a large number of memory cells (or Cells), and one memory cell can be uniquely selected by a Word Line and a Bit Line (BL). Specifically, a word line signal is given by the row decoding and control circuit so as to determine a target word line, and a bit line signal (or a CSL signal) is given by the column decoding and control circuit so as to determine a target bit line, so as to select the target memory cell in the memory array. In addition, in the above process, the SA array plays the role of signal amplification, and the drive circuit plays the role of signal drive.

Figure 2:
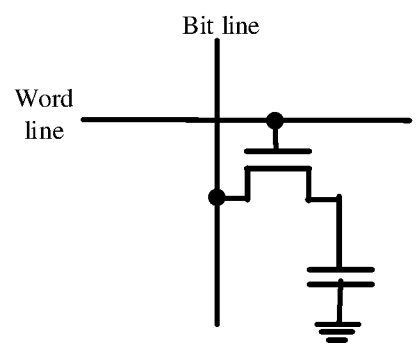
FIG. 2 is a structural schematic diagram of a memory cell according to an embodiment of the disclosure.

A plurality of structures of the memory cell are included, taking a memory cell in a 1T1C structure as an example, referring to FIG. 2, which illustrates a structural schematic diagram of a memory cell according to an embodiment of the disclosure. As shown in FIG. 2, the memory cell includes a transistor and a capacitor, and the gate of the transistor is connected to the word line and the drain of the transistor is connected to the bit line.

Figure 3:
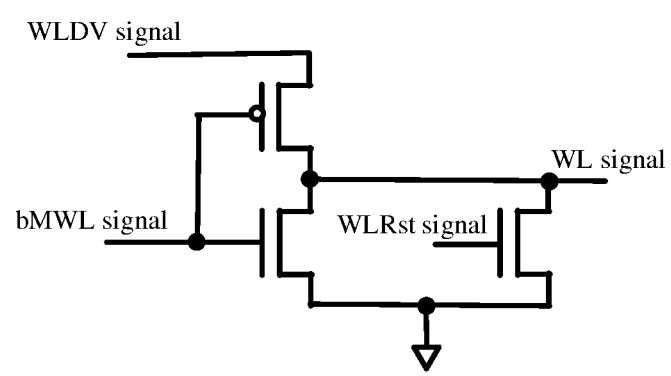
FIG. 3 is a structural schematic diagram of a Local WL Driver (LWD) according to an embodiment of the disclosure.
Figure 4:
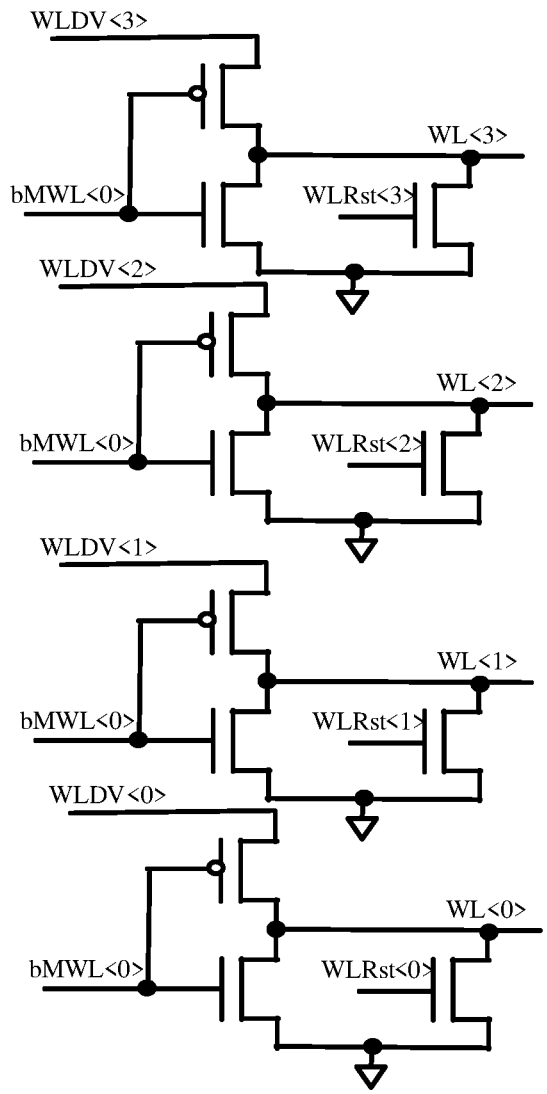
FIG. 4 is a structural schematic diagram of a group of LWDs according to an embodiment of the disclosure.

Particularly, each word line corresponds to an LWD. Referring to FIG. 3, which illustrates a structural schematic diagram of an LWD according to an embodiment of the disclosure. As shown in FIG. 3, each LWD is configured to receive a target word line drive signal (which may be represented by a WLDV signal), an inverted main word line drive signal (which may be represented by a bMWL signal) and a local decoding drive signal (which may be represented by a WLRst signal) output by the decoding drive circuit to select the target word line. According to relevant technical standards of the industry, referring to FIG. 4, which illustrates a structural schematic diagram of a group of LWDs according to an embodiment of the disclosure. As shown in FIG. 4, generally, four LWDs are taken as a group, that is, LWD×4. Here, WLDV<n> is configured to represent the WLDV signals with different decoding values, other signals are similar, and n is a natural number.

Figure 5:
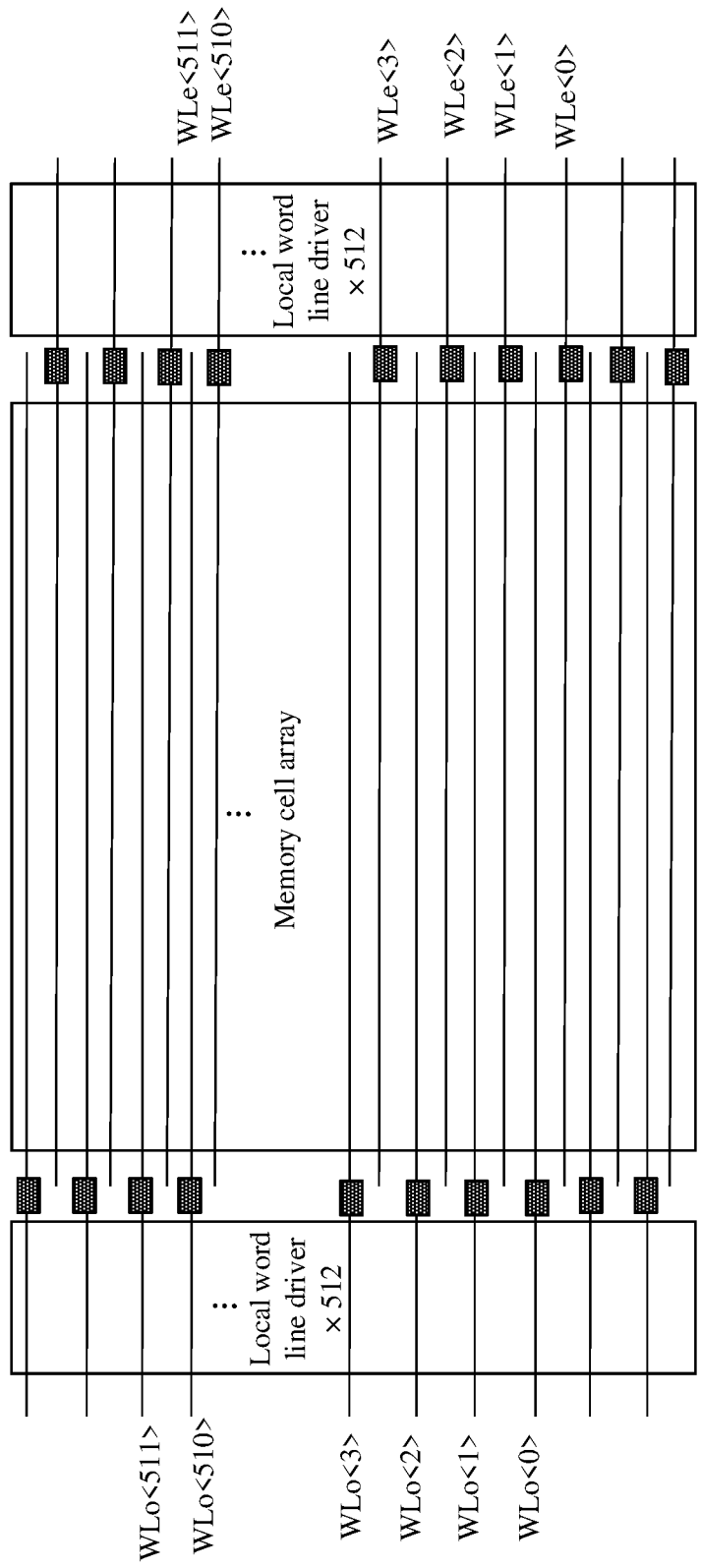
FIG. 5 is a local structural schematic diagram of another DRAM according to an embodiment of the disclosure.

Referring to FIG. 5, which illustrates a local structural schematic diagram of another DRAM according to an embodiment of the disclosure. As shown in FIG. 5, the memory cell array includes 1024 word lines and 1024 LWD units. Each of the LWD units is correspondingly connected to a word line, and these LWD units are placed on both sides of the memory cell array. For example, the LWD unit of the odd word line (that is, WLo) may be placed on the left, and the LWD unit of the even word line (that is, WLe) may be placed on the right.

Figure 6:
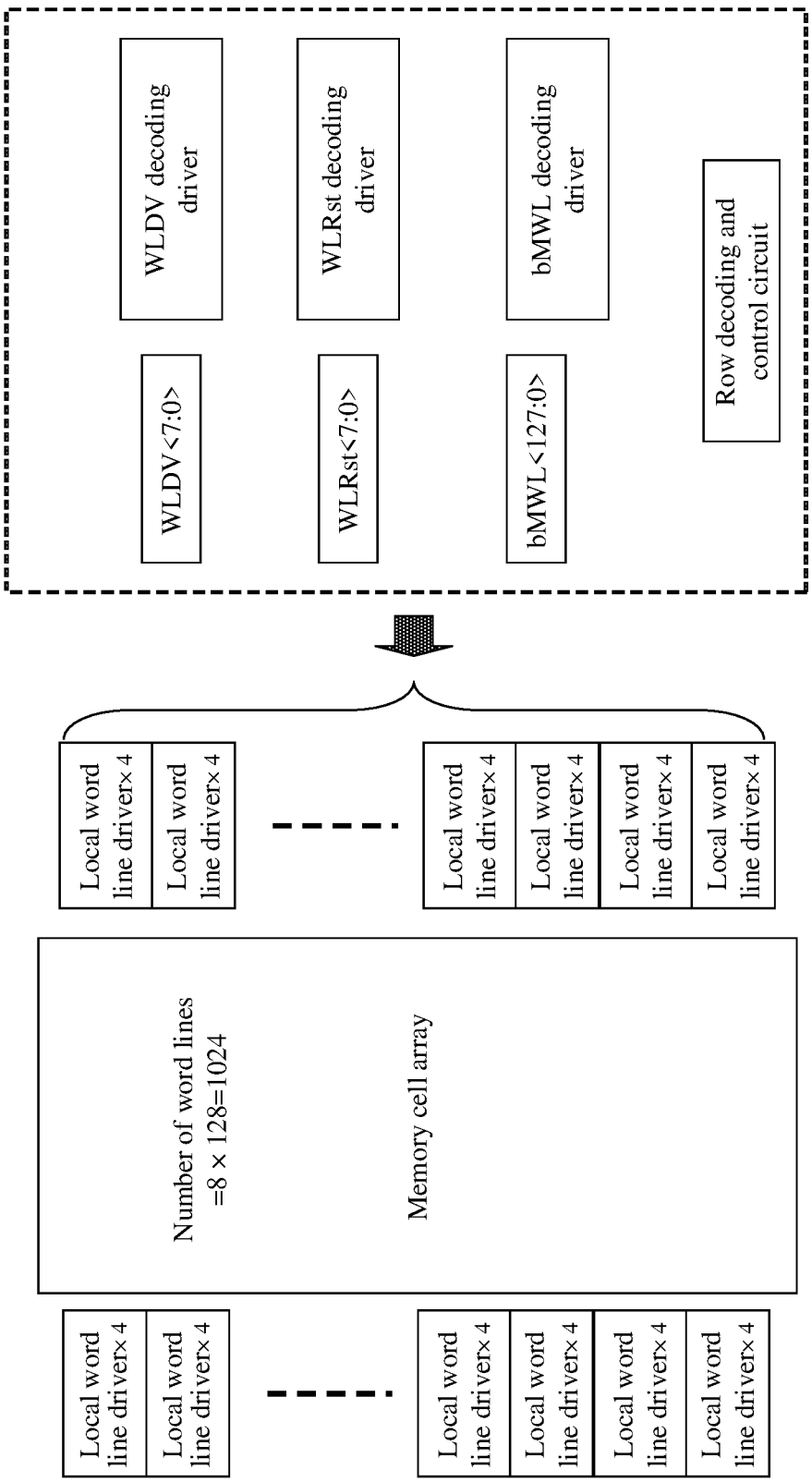
FIG. 6 is a local structural schematic diagram of yet another DRAM according to an embodiment of the disclosure.

The number of word lines in different specifications of memories may be different. According to the industry custom, 1024 word lines are generally used as a memory cell array (Array Mat). Specifically, for an Array Mat, explanation is made to the relationship between the row decoding and control circuit and the memory array unit. Referring to FIG. 6, which illustrates a local structural schematic diagram of yet another DRAM according to an embodiment of the disclosure. As shown in FIG. 6, the row decoding and control circuit (XDEC) includes a WLDV decoding driver, a WLRst decoding driver and a bMWL decoding driver, which are respectively configured to output a WLDV signal, a WLRst signal and a bMWL signal, so that the local driver selects the target word line according to the above three signals. According to the industry custom, the decoding value of the WLDV signal includes 0~7, the decoding value of the WLRst signal includes 0~7, and the decoding value of the bMWL signal includes 0~127. Specifically, WLDV <0, 2, 4, 6> and bMWL <0~127> enter the LWD unit on the right side of the memory cell array to drive 512 even word lines; and WLDV <1, 3, 5, 7> and bMWL <0~127> enter the LWD unit on the left side of an array subunit to drive 512 odd word lines.

Figure 7:
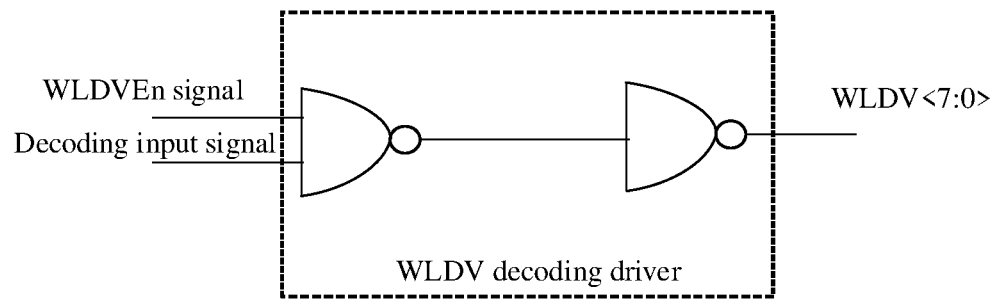
FIG. 7 is a structural schematic diagram of a WLDV decoding driver in some implementations.

For the WLDV decoding driver, referring to FIG. 7, which illustrates a structural schematic diagram of a WLDV decoding driver in some implementations. As shown in FIG. 7, the input of the WLDV decoding driver is a decoding input signal and a drive control signal (which may be represented by a WLDVEn signal), and there are 8 groups of WLDV decoding drivers in one Section, which correspond to WLDV <7:0> respectively.

Figure 8:
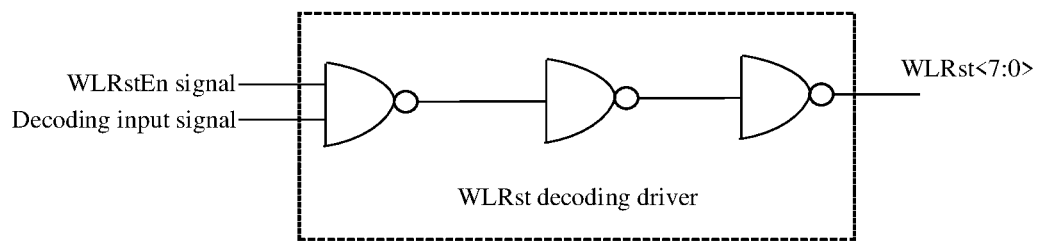
FIG. 8 is a structural schematic diagram of a WLRst decoding driver according to an embodiment of the disclosure.

For the WLRst decoding driver, referring to FIG. 8, which illustrates a structural schematic diagram of a WLRst decoding driver according to an embodiment of the disclosure. As shown in FIG. 8, the input of the WLRst decoding driver is a decoding input signal and a WLRstEn signal, and there are 8 groups of WLRst decoding drivers in one Array Mat, which correspond to WLRst <7:0> respectively.

Figure 9:
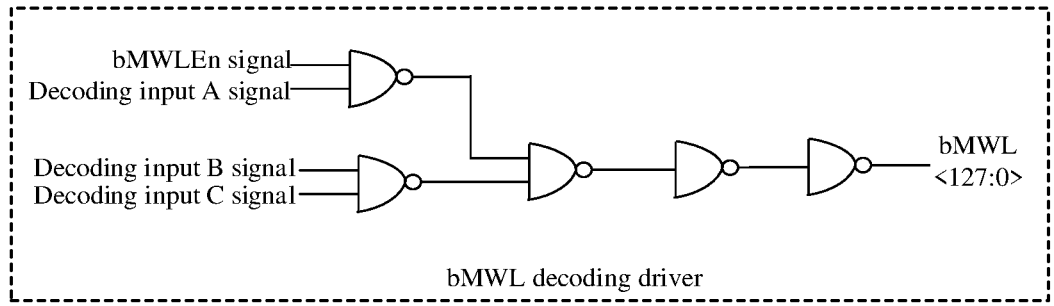
FIG. 9 is a structural schematic diagram of a bMWL decoding driver according to an embodiment of the disclosure.

For the bMWL decoding driver, referring to FIG. 9, which illustrates a structural schematic diagram of a bMWL decoding driver according to an embodiment of the disclosure. As shown in FIG. 9, the input of the bMWL decoding driver is a decoding input A signal, a decoding input B signal, a decoding input C signal and a bMWLEn signal. There are 128 groups of bMWL decoding drivers in one Array Mat, which correspond to bMWL <127:0> respectively.

In the above background art, the specific source and function of each signal may be referred to some implementations, and this part of content has no relation to the technical solution of the embodiments of the disclosure, which is not repeated here.

It is to be seen from the above that in some implementations, eight groups of WLDV decoding drivers with the same structure are needed to implement WLDV signals with different decoding values, which leads to a large circuit area and low circuit transfer efficiency, and affects the performance of the DRAM.

Based thereon, the embodiment of the disclosure provides a decoding drive circuit. The decoding drive circuit includes at least one decoding driver. The decoding driver includes a first-stage drive circuit and a second-stage drive circuit. Herein, the first-stage drive circuit is configured to receive an enabling control signal, a decoding input signal and a drive control signal, and generate a first drive signal and a second drive signal according to the enabling control signal, the drive control signal and the decoding input signal. The second-stage drive circuit is configured to generate a target word line drive signal according to the first drive signal and the second drive signal. Thus, based on the new decoding drive circuit provided by the embodiment of the disclosure, not only can the circuit efficiency be improved, but also the circuit area can be saved, and at the same time, the performance of the DRAM can also be improved.

Various embodiments of the present disclosure will now be described in detail in combination with the accompanying drawings.

Figure 10:
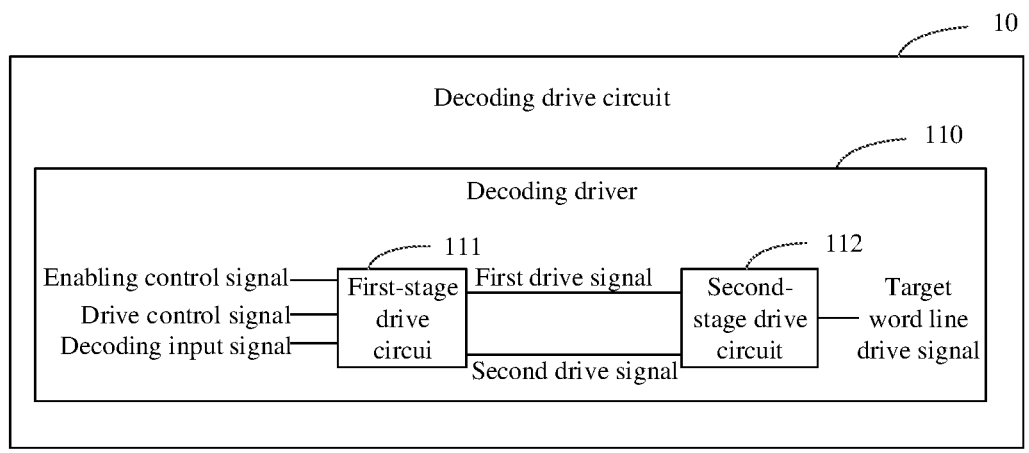
FIG. 10 is a structural schematic diagram of a decoding drive circuit according to an embodiment of the present disclosure.

In one embodiment of the disclosure, referring to FIG. 10, which illustrates a structural schematic diagram of a decoding drive circuit 10 according to an embodiment of the disclosure. As shown in FIG. 10, the decoding drive circuit 10 includes at least one decoding driver 110, and the decoding driver 110 includes a first-stage drive circuit 111 and a second-stage drive circuit 112.

The first-stage drive circuit 111 is configured to receive an enabling control signal, a decoding input signal and a drive control signal, and generate a first drive signal and a second drive signal according to the enabling control signal, the drive control signal and the decoding input signal.

The second-stage drive circuit 112 is connected to two output ends of the first-stage drive circuit 111 and is configured to generate a target word line drive signal according to the first drive signal and the second drive signal.

It is to be noted that the decoding drive circuit 10 provided by the embodiment of the present disclosure is applied to various signal drive scenarios, and those skilled in the art may flexibly apply same. For convenience of description, explanation is made below with the target word line drive signal (that is, the aforementioned WLDV signal) as an example, but this does not constitute a limitation to the embodiments of the disclosure.

According to the aforementioned content, there are eight different decoding values for the WLDV signal, that is, WLDV <7:0>. Therefore, the decoding drive circuit 10 includes at least one decoding driver 110 configured to correspond to different decoding values. Specifically, each decoding drive circuit 110 includes a first-stage drive circuit 111 and a second-stage drive circuit 112. In the working process, the first-stage drive circuit 111 is configured to receive the decoding input signal and the drive control signal, thereby generating the first drive signal and the second drive signal. Then, the second-stage drive circuit 112 receives the first drive signal and the second drive signal, and outputs a final target word line drive signal (that is, the WLDV signal).

Figure 11:
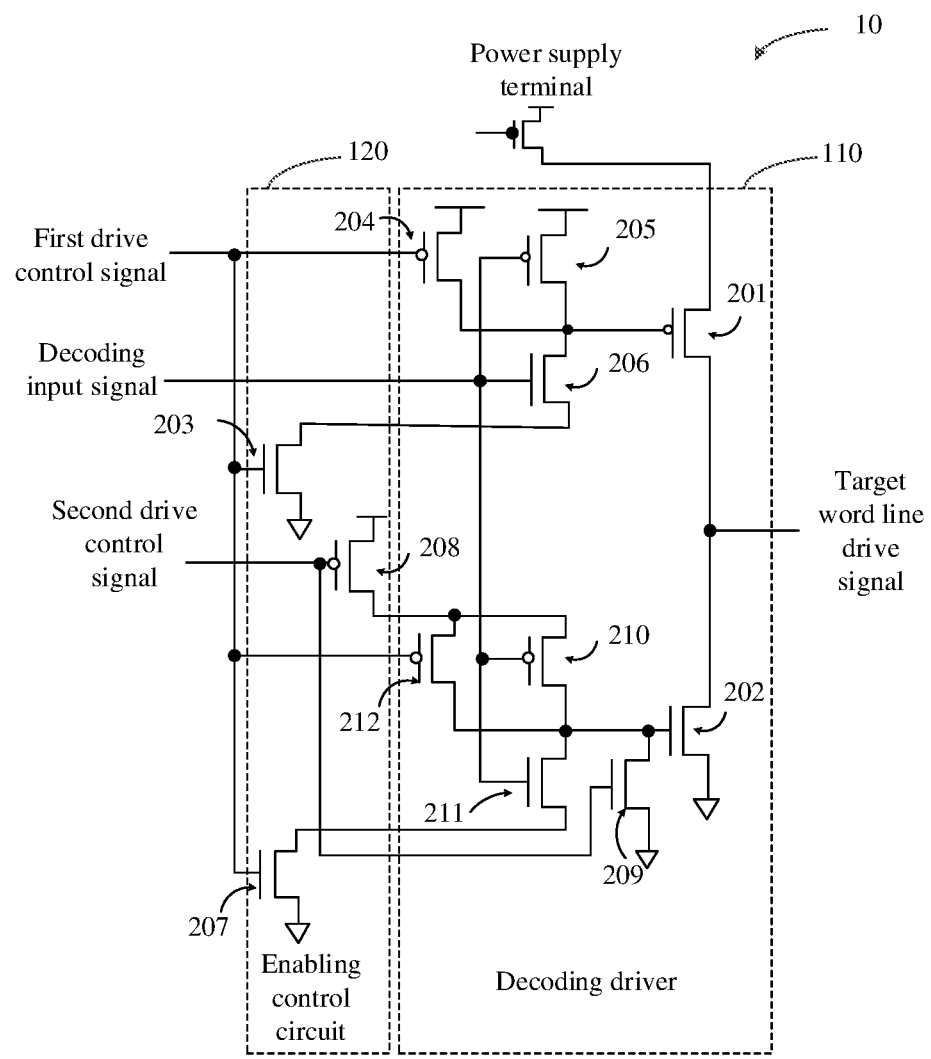
FIG. 11 is a structural schematic diagram of another decoding drive circuit according to an embodiment of the disclosure.

Furthermore, in some embodiments, referring to FIG. 11, which illustrates a structural schematic diagram of another decoding drive circuit 10 according to an embodiment of the disclosure. As shown in FIG. 11, the second-stage drive circuit 112 may include a first switch transistor 201 and a second switch transistor 201.

The second-stage drive circuit 112 is specifically configured to control the operating state of the first switch transistor 201 according to the first drive signal and control the operating state of the second switch transistor 202 according to the second drive signal, and generate the target word line drive signal according to the operating state of the first switch transistor 201 and the operating state of the second switch transistor 202.

It is to be noted that the second-stage drive circuit 112 is composed of two switch transistors. The operating state of the first switch transistor 201 is controlled by the first drive signal, the operating state of the second switch transistor 202 is controlled by the second drive signal, and the operating states of the first switch transistor 201 and the second switch transistor 202 determine the level state of the target word line drive signal.

It is also to be noted that, in some embodiments, the second-stage drive circuit 112 is specifically configured to control the target word line drive signal to be in a first level state when the first switch transistor 201 is in a turn-on state and the second switch transistor 202 is in a turn-off state. Or the second-stage drive circuit 112 is specifically configured to control the target word line drive signal to be in a second level state when the first switch transistor 201 is in the turn-off state and the second switch transistor 202 is in the turn-on state. Or the second-stage drive circuit 112 is specifically configured to control the target word line drive signal to be in a third level state when the first switch transistor 201 is in the turn-off state and the second switch transistor 202 is in the turn-off state.

It is to be noted that the driving principle of the second-stage drive circuit 112 is as follows.

In a first scenario, the target word line drive signal is in a first level state if the first switch transistor 201 is in a turn-on state and the second switch transistor 202 is in a turn-off state. Situation two: the target word line drive signal is in a second level state if the first switch transistor 201 is in the turn-off state and the second switch transistor 202 is in the turn-on state. Situation three: the target word line drive signal is in a third level state if the first switch transistor 201 is in the turn-off state and the second switch transistor 202 is in the turn-off state.

Exemplarily, the first level state is a high level state, the second level state is a low level state, and the third level state is a Floating state.

Furthermore, in some embodiments, as shown in FIG. 11, a first end of the first switch transistor 201 is connected to an output end of the first-stage drive circuit 112 for receiving the first drive signal. A first end of the second switch transistor 202 is connected to another output end of the first-stage drive circuit 112 for receiving the second drive signal. A second end of the first switch transistor 201 is connected to a first power supply terminal, and a second end of the second switch transistor 202 is connected to a grounding terminal. A third end of the first switch transistor 201 is connected to a third end of the second switch transistor 202 for outputting the target word line drive signal.

It is to be noted that, since the second end of the first switch transistor 201 is connected to the first power supply terminal, when the second switch transistor is turned on, the target word line drive signal is pulled up to a high level, that is, in a high level state. On the contrary, the second end of the second switch transistor 201 is grounded, so when the second switch transistor is turned on, the target word line drive signal is pulled down to a low level, that is, in a low level state. When both the first switch transistor 201 and the second switch transistor 202 are turned off, the target word line drive signal is in a Floating state, depending on a specific occurrence scenario.

In the embodiment, the switch transistors are all Metal-Oxide-Semiconductor Field-Effect Transistors (MOSFET, hereinafter referred to as MOS). Particularly, in FIG. 11, the circuit symbols of the first switch transistor 201 and the second switch transistor 202 are different, indicating that the two are different types of devices. The first switch transistor 201 may be a P-type channel field effect transistor (PMOS), and the second switch transistor 202 may be an N-type channel field effect transistor (NMOS). In the subsequent description of the embodiment of the disclosure, for all the field effect transistors, the first end indicates the gate, the second end indicates the source, and the third end indicates the drain. Therefore, for the PMOS, a pin at the right upper end is the second end, and a pin at the right lower end is the third end. For the NMOS, a pin at the upper right side is the third end, and a pin at the right lower side is the second end.

Of course, due to the diversity of circuit devices, the first switch transistor 201 and the second switch transistor 202 may be implemented by other circuit devices or a combination of circuit devices. The embodiment of the disclosure only provides a feasible related solution, but this solution does not constitute a limiting condition.

Furthermore, in some embodiments, the decoding drive circuit 10 further includes an enabling control circuit 120, and an output end of the enabling control circuit 120 is connected to an input end of the first-stage drive circuit 111. Herein, the enabling control circuit 120 is configured to output the enabling control signal according to the drive control signal.

It is to be noted that, as shown in FIG. 11, the decoding drive circuit further includes an enabling control circuit 120, and the enabling control circuit 120 assists the first-stage drive circuit 111 to complete first-stage drive. Specifically, the drive control signal may be input to the enabling control circuit 120 and the first-stage drive circuit 111 respectively, and the enabling control circuit 120 may first output the enabling control signal according to the drive control signal. Then, the first-stage drive circuit 111 jointly performs drive control on the decoding input signal according to the enabling control signal and the drive control signal, thereby obtaining the first drive signal and the second drive signal. Finally, the second-stage drive circuit 112 outputs the target word line drive signal according to the first drive signal and the second drive signal.

In some embodiments, the drive control signal includes a first drive control signal (which may be represented by a WLDVEn signal) and a second drive control signal (which may be represented by a WLDVEnN signal), and the level states of the first drive control signal and the second drive control signal are opposite. The first-stage drive circuit 111 includes a first control circuit and a second control circuit. At this time, the first control circuit is configured to perform drive control on the decoding input signal according to the first drive control signal and the enabling control signal to generate a first drive signal. The second control circuit is configured to perform drive control on the decoding input signal according to the first drive control signal, the second drive control signal and the enabling control signal to generate a second drive signal.

In a specific embodiment, as shown in FIG. 11, the enabling control circuit includes a third switch transistor 203, and the first control circuit includes a fourth switch transistor 204, a fifth switch transistor 205 and a sixth switch transistor 206. Herein, a first end of the third switch transistor 203 and a first end of the fourth switch transistor 204 receive the first drive control signal. A first end of the fifth switch transistor 205 and a first end of the sixth switch transistor 206 receive the decoding input signal. A third end of the fourth switch transistor 204, a third end of the fifth switch transistor 205 and a third end of the sixth switch transistor 206 are all connected to an output end of the first-stage drive circuit 111 for outputting the first drive signal. A third end of the third switch transistor 203 is connected to a second end of the sixth switch transistor 206, and a second end of the third switch transistor 203 is connected to the grounding terminal. A second end of the fourth switch transistor 204 is connected to a second power supply terminal, and a second end of the fifth switch transistor 205 is connected to a third power supply terminal.

In another specific embodiment, as shown in FIG. 11, the enabling control circuit further includes a seventh switch transistor 207 and an eighth switch transistor 208, and the second control circuit includes a ninth switch transistor 209, a tenth switch transistor 210, an eleventh switch transistor 211 and a twelfth switch transistor 212. Herein, a first end of the seventh switch transistor 207 and a first end of the twelfth switch transistor 212 receive the first drive control signal. A first end of the eighth switch transistor 218 and a first end of the ninth switch transistor 209 receive the second drive control signal. A first end of the tenth switch transistor 210 and a first end of the eleventh switch transistor 211 receive the decoding input signal. A third end of the ninth switch transistor 209, a third end of the tenth switch transistor 210, a third end of the eleventh switch transistor 211 and a third end of the twelfth switch transistor 212 are all connected to another output end of the second-stage drive circuit 112 for outputting the second drive signal. A third end of the eighth switch transistor 208, a second end of the tenth switch transistor 210 and a second end of the twelfth switch transistor 212 are connected, and a third end of the seventh switch transistor 207 is connected to a second end of the eleventh switch transistor 211. A second end of the seventh switch transistor 207 is connected to the grounding terminal, a second end of the eighth switch transistor 208 is connected to a fourth power supply terminal, and a second end of the ninth switch transistor 209 is connected to the grounding terminal.

Here, the first power supply terminal, the second power supply terminal, the third power supply terminal and the fourth power supply terminal all refer to power supply terminals capable of outputting stable voltage. Herein, the power supplies connected to the first power supply terminal, the second power supply terminal, the third power supply terminal and the fourth power supply terminal may be the same and may also be different. The specific is determined according to the actual application requirements, which is not specifically limited in the embodiment of the disclosure.

As shown in FIG. 11, the enabling control signal is a broad concept, including the outputs of the third switch transistor 203, the seventh switch transistor 207 and the eighth switch transistor 208.

Furthermore, in some embodiments, in an Array Mat of a semiconductor memory, the first power supply terminal may include a first-type first power supply terminal and a second-type first power supply terminal, and the decoding driver may be a first-type decoding driver or a second-type decoding driver. Herein, the first-type decoding driver shares the first-type first power supply terminal, and the second-type decoding driver shares the second-type first power supply terminal, and the word lines corresponding to the first-type decoding driver and the word lines corresponding to the second-type decoding driver are distributed in odd and even intervals.

It is to be noted that the decoding driver may be divided into the first-type decoding driver or the second-type decoding driver. The first-type decoding driver is configured to drive odd word lines, and the second-type decoding driver is configured to drive even word lines. In other words, the decoding driver of a decoding drive circuit may be the first-type decoding driver or the second-type decoding driver.

Accordingly, the first power supply terminal may include a first-type first power supply terminal and a second-type first power supply terminal, all the first-type decoding drivers share the first-type first power supply terminal, and all the second-type decoding drivers share the second-type first power supply terminal. Thus, not only the number of power supply terminals is saved, but also fault positioning may be performed using the first-type first power supply terminal/the second-type first power supply terminal (referring to the subsequent description).

Exemplarily, the specific connection mode of the first-type first power supply terminal and the second-type first power supply terminal is as follows: the first-type first power supply terminal is connected to the second end of the first switch transistor in the first-type decoding driver, and is configured to supply power to the first-type decoding driver. The second-type first power supply terminal is connected to the second end of the first switch transistor in the second-type decoding driver and is configured to supply power to the second-type decoding driver.

In addition, for the first-type first power supply terminal and the second-type first power supply terminal, the power supplies connected to the first-type first power supply terminal and the second-type first power supply terminal may be the same and may also be different. The specific is determined according to the actual application requirements, which is not specifically limited in the embodiment of the disclosure.

Thus, the first-type decoding driver is configured to receive the decoding input signal and the drive control signal, and generate a target word line drive signal corresponding to the first-type word line. The second-type decoding driver is configured to receive the decoding input signal and the drive control signal and generate a target word line drive signal corresponding to the second-type word line.

It is to be understood that the first-type word lines and the second-type word lines are distributed in odd and even intervals. For example, the first-type word lines are odd word lines and the second-type word lines are even word lines. Or the first-type word lines are even word lines and the second-type word lines are odd word lines.

Furthermore, in some embodiments, when both the number of the first-type decoding drivers and the number of the second-type decoding drivers are two or more, in one decoding drive circuit 10, every two first-type decoding drivers share one enabling control circuit 120, or every two second-type decoding drivers share one enabling control circuit 120.

It is to be noted that for the decoding drive circuit 10, every two decoding drivers therein are enabled to share the enabling control circuit 120. It is to be understood that since the sharing of the first power supply terminal already exists in the foregoing, it is preferable that the decoding drivers sharing the enabling control circuit 120 also share the same first power supply terminal.

That is, the decoding drive circuit 10 may include an enabling control circuit 120 and two first-type decoding driving units. Or the decoding drive circuit 10 may include an enabling control circuit 120 and two second-type decoding drivers. In addition, in one decoding drive circuit 10, different decoding drivers receive different decoding input signals, so that different target word line signals can be output. For an Array Mat in a semiconductor memory, multiple sets of decoding drive circuits 10 may be set according to the actual application requirements.

In addition, it is also possible to control the enabling control circuit shared by every four decoding drivers. Therefore, in some embodiments, when both the number of the first-type decoding drivers and the number of the second-type decoding drivers are four or more, in one decoding drive circuit 10, every four first-type decoding drivers share one enabling control circuit 120, or every four second-type decoding drivers share one enabling control circuit 120.

That is, the decoding drive circuit 10 may include an enabling control circuit 120 and four first-type decoding driving units. Or the decoding drive circuit 10 may include an enabling control circuit 120 and four second-type decoding drivers. Similarly, for an Array Mat in a semiconductor memory, multiple sets of decoding drive circuits 10 may be set according to the actual application requirements.

Taking the target word line decoding signal having eight different decoding values (WLDV <7:0>) as an example, detailed description is made below to circuit sharing.

Figure 12:
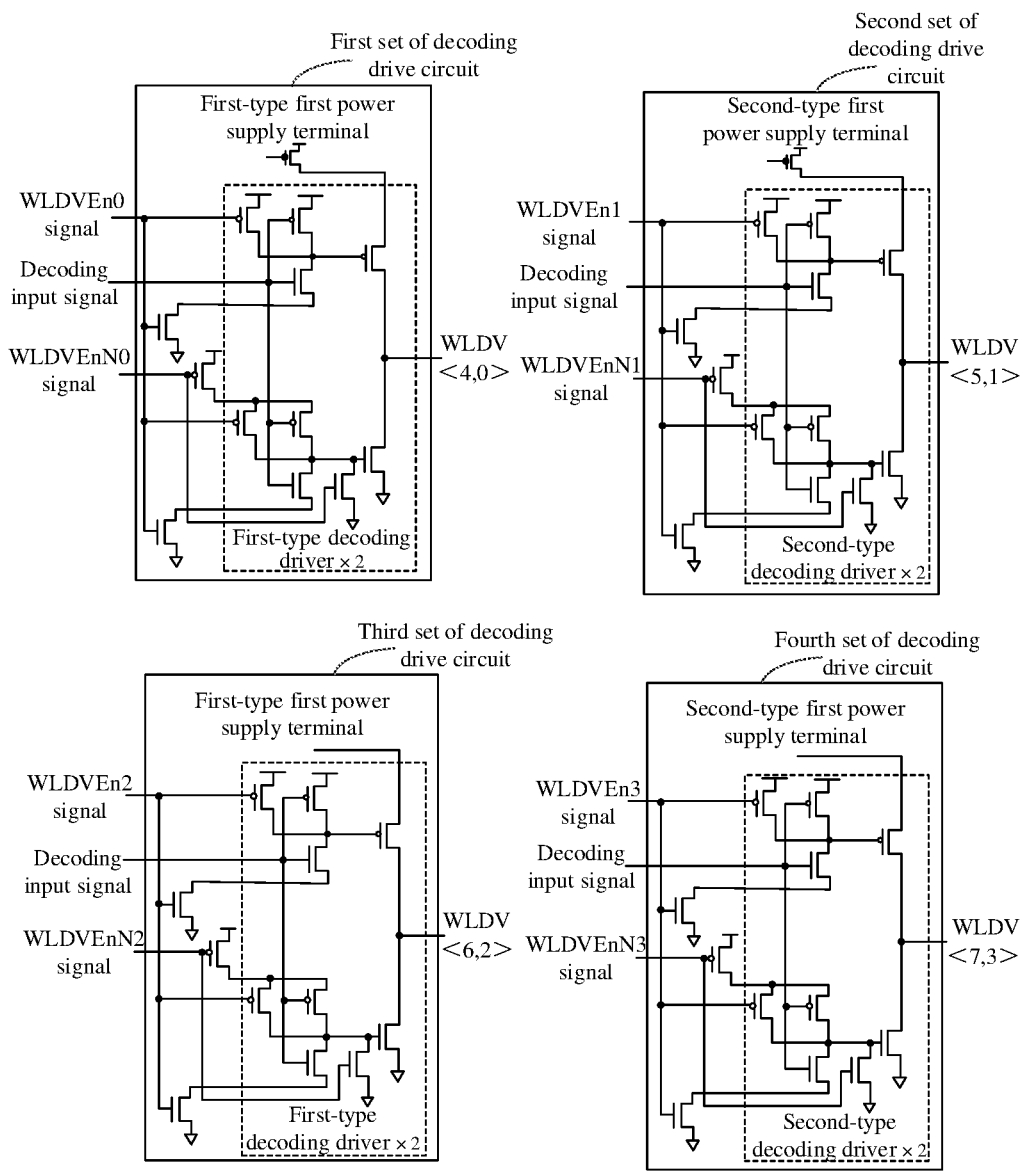
FIG. 12 is a specific structural schematic diagram of a decoding driver according to an embodiment of the disclosure.

In one case, referring to FIG. 12, which illustrates a specific structural schematic diagram of a decoding driver according to an embodiment of the disclosure. It is to be understood that in FIG. 12, there are two sets of dashed box circuits in an actual circuit structure, that is, the first-type decoding driver x2 or the second-type decoding driver x2.

As shown in FIG. 12, for the WLDV signal, an Array Mat in a semiconductor memory includes four sets of decoding drive circuits, and the input signals of each set of decoding drive circuit are a WLDVEn signal (equivalent to a first drive control signal), a decoding input signal and a WLDVEnN signal (equivalent to a second drive control signal).

The first set of decoding drive circuit includes an enabling control circuit and two first-type decoding drivers for outputting WLDV <4, 0>.

The third set of decoding drive circuit includes an enabling control circuit and two first-type decoding drivers for outputting WLDV <6, 2>, and the two first-type decoding drivers in the first set of decoding drive circuits and the two first-type decoding drivers in the third set of decoding drive circuits share the first-type first power supply terminal (PWLDV0).

The second set of decoding drive circuit includes an enabling control circuit and two second-type decoding drivers for outputting WLDV <5, 1>.

The fourth set of decoding drive circuit includes an enabling control circuit and two second-type decoding drivers for outputting WLDV <7, 3>, and the two second-type decoding drivers in the second set of decoding drive circuit and the two second-type decoding drivers in the fourth set of decoding drive circuit share the second-type first power supply terminal (PWLDV1).

Figure 13:
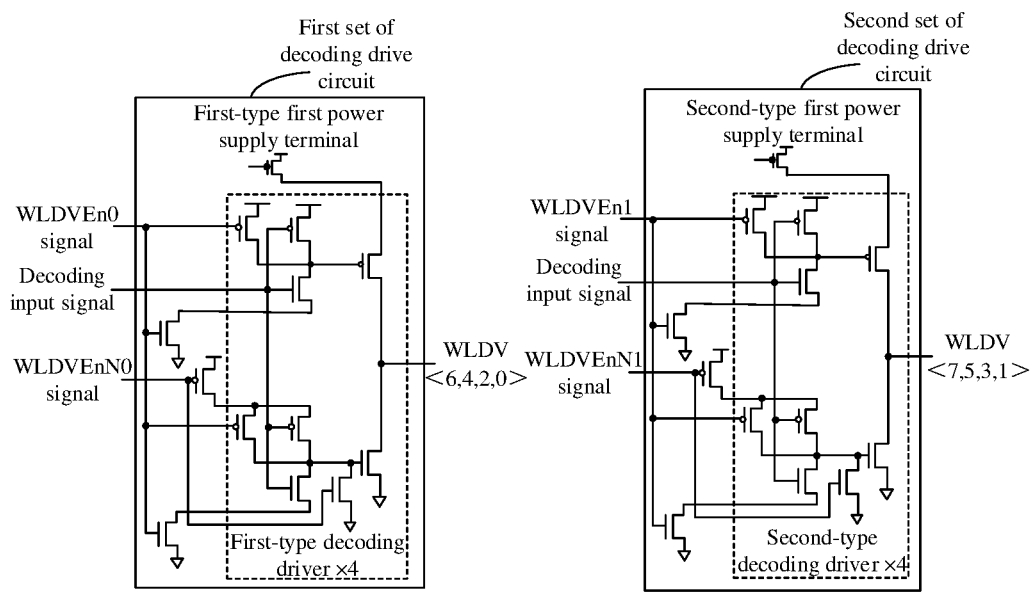
FIG. 13 is a specific structural schematic diagram of another decoding drive circuit according to an embodiment of the disclosure.

In another case, referring to FIG. 13, which illustrates a specific structural schematic diagram of another decoding driver according to an embodiment of the disclosure. It is to be understood that in FIG. 13, there are four sets of dashed box circuits in an actual circuit structure, that is, the first-type decoding driver x4 or the second-type decoding driver x4.

As shown in FIG. 13, for the WLDV signal, an Array Mat in a semiconductor memory includes two sets of decoding drive circuits, and the input signals of each set of decoding drive circuit are a WLDVEn signal (equivalent to a first drive control signal), a decoding input signal and a WLDVEnN signal (equivalent to a second drive control signal).

The first set of decoding drive circuit includes an enabling control circuit and four first-type decoding drivers for outputting WLDV <0, 2, 4, 6>, and the four first-type decoding drivers in the first set of decoding drive circuit share the first-type first power supply terminal.

The second set of decoding drive circuit includes an enabling control circuit and four second-type decoding drivers for outputting WLDV <1, 3, 5, 7>, and the four second-type decoding drivers in the second set of decoding drive circuit share the second-type first power supply terminal.

It is to be understood that different sharing forms may bring a performance trade-off, which needs to be designed according to the actual application environment and test requirements.

In the embodiment of the disclosure, a brand-new decoding drive circuit is provided for the WLDV signal, such as the circuit structure shown in FIG. 12 or FIG. 13. The decoding drive circuit 10 includes at least one decoding driver 110, and each decoding driver 110 includes two-stage drive circuits. A first-stage amplifying circuit 111 performs first-stage amplification on the decoding input signal according to the enabling control signal and the driving control signal to obtain a first drive signal and a second drive signal. A second-stage amplifying circuit 111 generates a target word line drive signal according to the first drive signal and the second drive signal. In addition, the enabling control circuit 120 and the power supply terminal are shared by different decoding drivers, thereby improving the circuit efficiency, saving the circuit area and finally improving the performance of the DRAM.

It is also to be noted that in FIGS. 11-13, the types of the first switch transistor 201, the second switch transistor 202, the third switch transistor 203, the fourth switch transistor 204, the fifth switch transistor 205, the sixth switch transistor 206, the seventh switch transistor 207, the eighth switch transistor 208, the ninth switch transistor 209, the tenth switch transistor 210, the eleventh switch transistor 211 and the twelfth switch transistor 212 are Metal-Oxide-Semiconductor Field-Effect Transistors. A first end of the Metal-Oxide-Semiconductor Field-Effect Transistor is a gate end, a second end of the Metal-Oxide-Semiconductor Field-Effect Transistor is a source end, and a third end of the Metal-Oxide-Semiconductor Field-Effect Transistor is a drain end.

Furthermore, the first switch transistor 201, the third switch transistor 203, the fourth switch transistor 204, the sixth switch transistor 206, the seventh switch transistor 207 and the eleventh switch transistor 211 are PMOS, while the second switch transistor 202, the fifth switch transistor 205, the tenth switch transistor 210, the eighth switch transistor 208 and the twelfth switch transistor 212 are NMOS.

In conclusion, as shown in FIGS. 10-13, the embodiments of the disclosure provide a new decoding drive circuit, which may output the WLDV signal. For an Array Mat in the semiconductor memory, a total of eight groups of decoding drivers 110 are needed to output WLDV <7:0>.

In each WLDV decoding driver, the first switch transistor 201/second switch transistor 202 constitutes a basic final-stage driver of the WLDV signal, and the third switch transistor 203/fourth switch transistor 204/fifth switch transistor 205/sixth switch transistor 206 constitutes the control and front-stage drive of the first switch transistor 201.

The seventh switch transistor 207/eighth switch transistor 208/ninth switch transistor 209/tenth switch transistor 210/eleventh switch transistor 211/twelfth switch transistor 212 constitutes the control and front-stage drive of the second switch transistor 202.

Particularly, the third switch transistor 203/seventh switch transistor 207/eighth switch transistor 208 is shared (equivalent to using a control circuit) by every two WLDV decoding drivers/every four WLDV decoding drivers, thus saving the area and improving the circuit efficiency.

The power supply terminals of the first switch transistors 201 of different WLDV decoding drivers are also divided into two groups, and every four WLDV decoding drivers, that is, WLDV <0, 2, 4, 6> share a group, and WLDV <1, 3, 5, 7> share a group, which respectively correspond to the odd and even word lines in the memory cell array. Thus, by separate control through the odd and even word lines, the states of adjacent word lines can be controlled respectively during a test, and a Leakage path is analyzed (referring to the following content).

In addition, the input of the decoding driver includes WLDVEn0/WLDVEnN0 (equivalent to a drive control signal) and a decoding input signal, and these three signals may control the state combination of the first switch transistor 201/the second switch transistor 202: (1) the first switch transistor 201 is turned on/the second switch transistor 202 is turned off; (2) the first switch transistor 201 is turned off/the second switch transistor 202 is turned on; and (3) the first switch transistor 201 is turned off/the second switch transistor 202 is turned off, thereby controlling the level state of the target word line drive signal.

Particularly, for FIG. 12, in the actual application process, during normal operation, when WLDVEnN0=WLDVEnN1=WLDVEnN2=WLDVEnN3=0, WLDVEn0=WLDVEn1=WLDVEn2=WLDVEn3=(assuming being WLDVEn), the state of WLDV <7:0> is simply controlled by eight decoding inputs and a WLDVEn signal.

The embodiments of the disclosure provide a decoding drive circuit. The decoding drive circuit includes at least one decoding driver. The decoding driver includes a first-stage drive circuit and a second-stage drive circuit. Herein, the first-stage drive circuit is configured to receive an enabling control signal, a decoding input signal and a drive control signal, and generate a first drive signal and a second drive signal according to the enabling control signal, the drive control signal and the decoding input signal. The second-stage drive circuit is configured to generate a target word line drive signal according to the first drive signal and the second drive signal. Thus, the embodiments of the disclosure provide a new decoding drive circuit. The decoding drive circuit performs two-stage amplification on the decoding input signal according to the drive control signal, which can not only improve the circuit efficiency, but also save the circuit area and can improve the drive performance at the same time.

Figure 14:
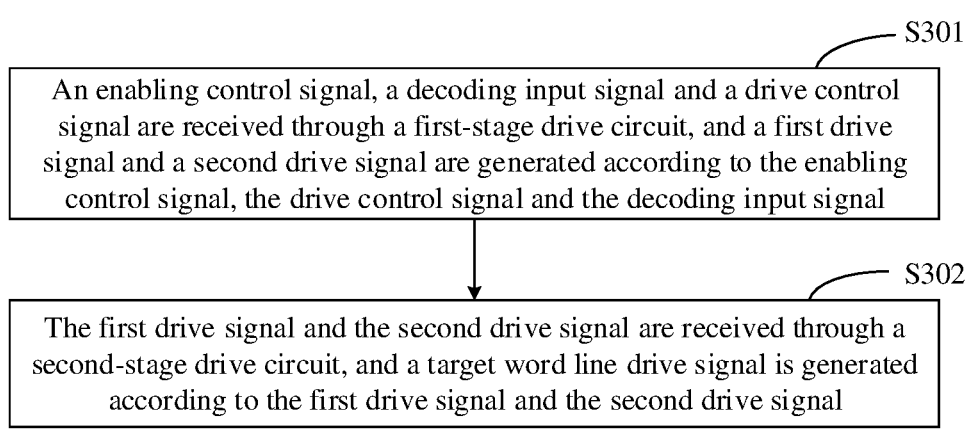
FIG. 14 is a flowchart of a method for decoding drive according to an embodiment of the disclosure.

In another embodiment of the disclosure, referring to FIG. 14, which illustrates a flowchart of a method for decoding drive according to an embodiment of the disclosure. As shown in FIG. 14, the method may include the following operations.

At S301, an enabling control signal, a decoding input signal and a drive control signal are received through a first-stage drive circuit, and a first drive signal and a second drive signal are generated according to the enabling control signal, the drive control signal and the decoding input signal.

At S302, the first drive signal and the second drive signal are received through a second-stage drive circuit, and a target word line drive signal is generated according to the first drive signal and the second drive signal.

It is to be noted that the method for decoding drive provided by the embodiment of the disclosure is applied to the aforementioned decoding drive circuit. Moreover, the decoding drive circuit includes at least one decoding driver, and the decoding driver includes a first-stage drive circuit and a second-stage drive circuit.

Therefore, the enabling control signal, the decoding input signal and the drive control signal are received through the first-stage drive circuit, and drive control is performed on the enabling control signal, the drive control signal and the decoding input signal to generate the first drive signal and the second drive signal. Then, the second-stage drive circuit performs drive control according to the first drive signal and the second drive signal to finally generate the target word line drive signal.

It is also to be noted that the decoding drive circuit further includes an enabling control circuit, and an output end of the enabling control circuit is connected to an input end of the first-stage drive circuit. Therefore, in some embodiments, the method may further include the following operations.

The enabling control signal is generated according to the drive control signal by the enabling control circuit.

It is to be noted that the aforementioned drive control signals are respectively input to the enabling control circuit and the first-stage drive circuit. The enabling control circuit performs enabling control processing according to the drive control signal to obtain the enabling control signal, and then the first-stage drive circuit performs drive control on the decoding input signal according to the drive control signal and the enabling control signal to obtain the first drive signal and the second drive signal.

Specifically, the drive control signal includes a first drive control signal and a second drive control signal, and the first-stage drive circuit includes a first control circuit and a second control circuit. Therefore, in some embodiments, the operation of receiving an enabling control signal, a decoding input signal and a drive control signal through a first-stage drive circuit, and generating a first drive signal and a second drive signal according to the enabling control signal and the drive control signal may include the following operations.

The first drive control signal, the enabling control signal and the decoding input signal are received through a first control circuit, and drive control is performed on the decoding input signal according to the first drive control signal and the enabling control signal to generate the first drive signal.

The first drive control signal, the second drive control signal, the enabling control signal and the decoding input signal are received through a second control circuit, and drive control is performed on the decoding input signal according to the first drive control signal, the second drive control signal and the enabling control signal to generate the second drive signal.

Here, a level state of the first drive control signal is different from a level state of the second drive control signal.

It is also to be noted that the second-stage drive circuit includes a first switch transistor and a second switch transistor. Therefore, in some embodiments, the operation of generating a target word line drive signal according to the first drive signal and the second drive signal may include the following operations.

The operating state of the first switch transistor is controlled according to the first drive signal; the operating state of the second switch transistor is controlled according to the second drive signal; and the target word line drive signal is generated according to the operating state of the first switch transistor and the operating state of the second switch transistor.

It is to be noted that the first drive signal can control the first switch transistor to be in a turn-on or turn-off state, and the second drive signal can control the second switch transistor to be in a turn-on or turn-off state. According to the states of the first switch transistor and the second switch transistor, the level states of the target word line drive signals are different.

In a specific embodiment, the operation of generating the target word line drive signal according to the operating state of the first switch transistor and the operating state of the second switch transistor may include the following operations.

The target word line drive signal is controlled to be in a first level state when the first switch transistor is in a turn-on state and the second switch transistor is in a turn-off state. Or the target word line drive signal is controlled to be in a second level state when the first switch transistor is in the turn-off state and the second switch transistor is in the turn-on state. Or the target word line drive signal is controlled to be in a third level state when the first switch transistor is in the turn-off state and the second switch transistor is in the turn-off state.

It is to be noted that the target word line drive signal is in the first level state if the first switch transistor is turned on and the second switch transistor is turned off; the target word line drive signal is in the second level state if the first switch transistor is turned off and the second switch transistor is turned on; and the target word line drive signal is in the third level state if the first switch transistor is turned off and the second switch transistor is turned off. Here, the first level state is a high level state, the second level state is a low level state, and the third level state is a Floating state.

Furthermore, the target word line drive signal may be a WLDV signal. It is to be learned, according to the related background content (FIGS. 1 to 9), that the WLDV signal, the WLRst signal and the bMWL signal are jointly used to determine a WL signal, and the WL signal is used to select a word line. That is, the WL signal can control the level state of the word line. In other words, the level state of the target word line includes a high level state, a low level state and a Floating state, and the level state of the target word line is correlated with the target word line drive signal.

Furthermore, in some embodiments, the decoding driver includes at least one first-type decoding driver or at least one second-type decoding driver.

At least one first-type decoding driver shares a first-type first power supply terminal, and at least one second-type decoding driver shares a second-type first power supply terminal, and the word lines corresponding to the first-type decoding driver and the word lines corresponding to the second-type decoding driver are distributed in odd and even intervals.

It is to be noted that, according to the aforementioned content, the decoding drive circuit includes at least one decoding driver, and these decoding drivers are respectively used to determine different target word line decoding signals, for example, WLDV <7:0>. The WLDV <7:0> may be matched with bMWL <127:0> to select different word lines.

In addition, the decoding driver may be the first-type decoding driver or the second-type decoding driver, and the word lines corresponding to the first-type decoding driver and the word lines corresponding to the second-type decoding driver are distributed in odd and even intervals. Here, the first-type decoding drivers share the first-type first power supply terminal, and the second-type decoding drivers share the second-type power supply terminal.

In other words, all the first-type decoding drivers of odd word lines share one first power supply terminal, and all the first-type decoding drivers of even word lines share another first power supply terminal, so that the adjacent word lines may be subjected to different power supply control. Due to such a circuit structure, the embodiment of the present disclosure also provides a method for detecting a word line defect, which is described in detail below.

In some embodiments, the target word line includes a first word line and a to-be-detected word line, and the first word line is adjacent to the to-be-detected word line. The method may further include the following operations.

The first word line is turned on so that the first word line is in a high level state. The to-be-detected word line is controlled to change from a low level state to a Floating state. If it is detected that the data stored in the to-be-detected word line changes, it is determined that there is a short circuit defect between the to-be-detected word line and the first word line.

It is to be noted that two adjacent word lines in the memory cell array are taken and respectively called the first word line and the to-be-detected word line. First, the first word line is turned on. That is, the first word line is in a high level state. Then, the to-be-detected word line is controlled to change from the low level state to the Floating state. At the moment, if there is a short circuit defect between the to-be-detected word line and the first word line, the to-be-detected word line may be pulled up to the high level state by the first word line, and the data stored in the level state of the to-be-detected word line may change. Thus, a manufacturing defect between the to-be-detected word line and the first word line may be detected.

Here, the first word line and the to-be-detected word line may be any two adjacent word lines in the memory cell array.

Figure 15A:
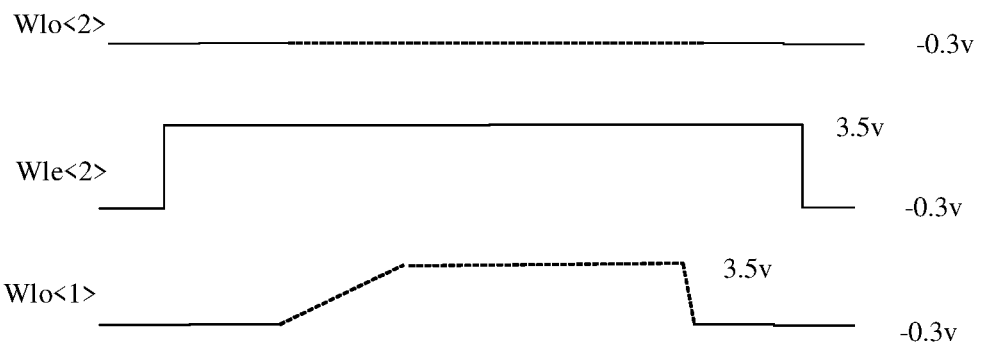
FIG. 15A is a process diagram of a short circuit defect detection according to an embodiment of the disclosure.

Referring to FIG. 15A, which illustrates a process diagram of a short circuit defect detection according to an embodiment of the disclosure. As shown in FIG. 15A, Wlo <1>/Wle <2>/Wlo <2> are physically adjacent in the memory cell array (as shown in FIG. 5), with Wlo <1> or Wlo <2> as the to-be-detected word line and Wle <2> as the first word line.

Specifically, different data patterns of these word lines may be written in sequence, and then only Wle <2> (for example, to 3.5 v) is turned on. Next, Wlo <1> and Wlo <2> are in the Floating state from a low potential (for example, −0.3 v). If there is a short circuit between Wlo <1> and Wle <2>, same may be pulled high, and the saved data may change with Wle <2>. As shown in FIG. 15A, if there is a short circuit between Wlo <1> and Wle <2>, the level state of Wlo <1> may be pulled high, and the data stored in Wlo <1> may also change with Wle <2>. Thus, when a worker detects the change of data stored in Wlo <1>, it may be determined that there is a manufacturing fault between Wlo <1> and Wle <2>.

Figure 15B:
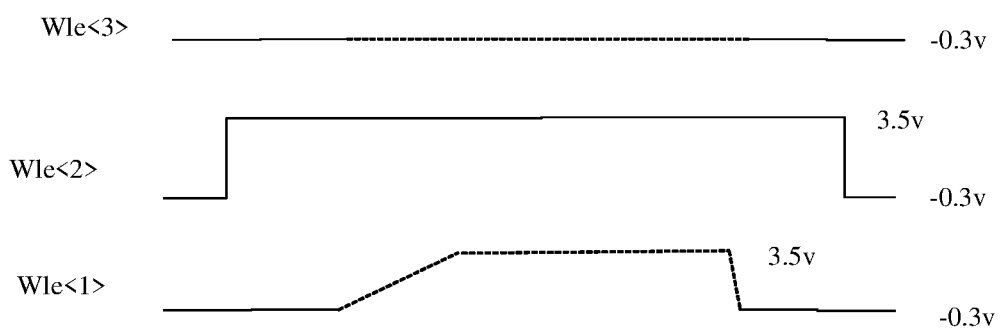
FIG. 15B is a process diagram of another short circuit defect detection according to an embodiment of the disclosure.

As shown in FIG. 15B, Wle <1>/Wle <2>/Wle <3> is in a physically adjacent state in the LWD on the right side of the memory cell array (as shown in FIG. 5). Wle <1> or Wle <3> is the to-be-detected word line, and Wle <2> is the first word line. Similarly, Wle <2> is controlled to be in a high level state (for example, to 3.5 v), and Wlo <1> and Wlo <2> are controlled to be in a Floating state from a low potential (for example, −0.3 v). If the data stored in Wle <1> or Wle <3> changes, there is a manufacturing fault between the changed word line and Wle <2>.

Similarly, in some embodiments, the following method may also be used for fault detection.

The first word line is turned off so that the first word line is in a low level state. The to-be-detected word line is turned on so that the to-be-detected word line is in a high-level state, and the to-be-detected word line is controlled to be in a Floating state from the high-level state. If it is detected that the data of the to-be-detected word line fails to be written, it is determined that there is a short circuit defect between the to-be-detected word line and the first word line.

It is to be noted that the embodiment of the disclosure further provides another method for fault detection.

First, the first word line is turned off. That is, the first word line is in a low level state. Then, the to-be-detected word line is turned on to control the to-be-detected word line to change from the high level state to the Floating state. At the moment, if there is no short circuit between the to-be-detected word line and the first word line, the to-be-detected word line shall remain in a high level state (turn-on state), and data may be written to the to-be-detected word line. However, if there is a short circuit between the to-be-detected word line and the first word line, the to-be-detected word line shall be pulled down to the low level state (turn-off state), and data cannot be written to the to-be-detected word line at the moment. Thus, a manufacturing defect between the to-be-detected word line and the first word line may be detected.

Figure 16A:
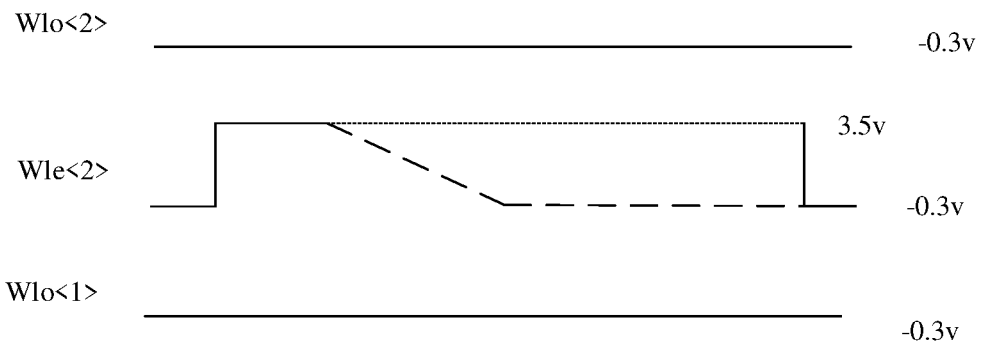
FIG. 16A is a process diagram of yet another short circuit defect detection according to an embodiment of the disclosure.

Referring to FIG. 16A, which illustrates a process diagram of yet another short circuit defect detection according to an embodiment of the disclosure. As shown in FIG. 16A, Wle <2> is the to-be-detected word line, and Wlo <1> and Wlo <2> are the first word line. First, Wle <2> is turned on (for example, to 3.5 v), and Wle <2> is controlled to change from a high level state to a Floating state. At the moment, since neither Wlo <1> nor Wlo <2> is turned on, both are in a low level state. If there is a short circuit between Wle <2> and Wlo <1> (or Wle <2> and Wlo <2>), Wle <2> may be pulled low. That is, the turn-on state of Wle <2> fails, and data cannot be written thereto. Thus, it may be judged whether Wle <2> has a manufacturing defect.

Figure 16B:
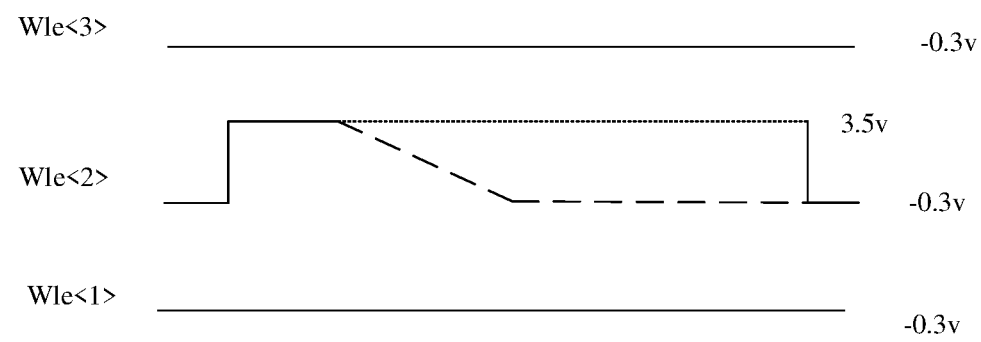
FIG. 16B is a process diagram of still another short circuit defect detection according to an embodiment of the disclosure.

As shown in FIG. 16B, Wle <2> is the to-be-detected word line, and Wle <1> or Wle <3> is the first word line. Similarly, Wle <2> is controlled to change from a high level state (for example, to 3.5 v) to a Floating state, and Wle <1> or Wle <3> is a turn-off state. If data cannot be written to Wle <2>, there is a manufacturing defect in Wle <2>.

In conclusion, the method for decoding drive provided by the embodiment of the disclosure may not only improve the decoding drive efficiency and save the circuit area, but also quickly detect whether the adjacent word lines have a manufacturing defect or not.

The embodiments of the disclosure provide a method for decoding drive. The method is applied to a decoding drive circuit. The decoding drive circuit includes at least one decoding driver, and the decoding driver includes a first-stage drive circuit and a second-stage drive circuit. A first drive control signal, an enabling control signal and a decoding input signal are received through the first control circuit, and drive control is performed on a decoding input signal according to the first drive control signal and the enabling control signal to generate a first drive signal. The first drive control signal, the second drive control signal, the enabling control signal and the decoding input signal are received through the second control circuit, and drive control is performed on the decoding input signal according to the first drive control signal, the second drive control signal and the enabling control signal to generate a second drive signal. Thus, by providing a new decoding drive circuit, the decoding input signal is subjected to two-stage amplification according to the drive control signal, which can improve the circuit efficiency, save the circuit area, quickly detect whether the adjacent word lines have a manufacturing defect or not, and finally improve the performance of the DRAM.

Figure 17:
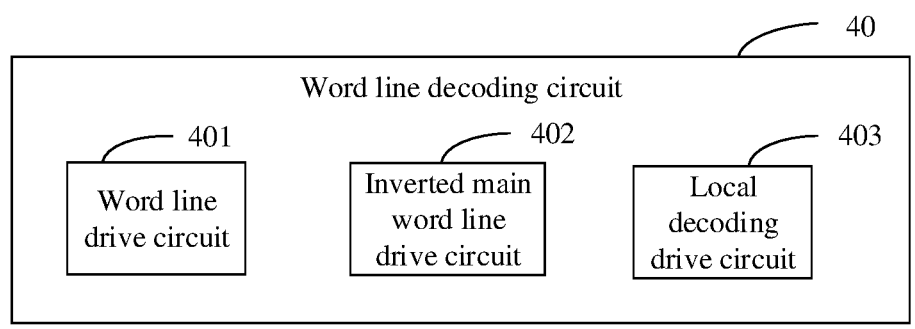
FIG. 17 is a structural schematic diagram of a word line decoding circuit according to an embodiment of the disclosure.

In yet another embodiment of the disclosure, referring to FIG. 17, which illustrates a structural schematic diagram of a word line decoding circuit 40 according to an embodiment of the disclosure. As shown in FIG. 17, the word line decoding circuit 40 includes a word line drive circuit 401 (for outputting a WLDV signal), an inverted main word line drive circuit 402 (for outputting a bMWL signal) and a local decoding drive circuit (for outputting a WLRst signal). Herein, the word line drive circuit 401 at least includes the aforementioned decoding drive circuit 10.

Since the word line decoding circuit 40 includes the aforementioned decoding drive circuit 10, the decoding drive circuit performs two-stage amplification on the decoding input signal according to the drive control signal, which can not only improve the circuit efficiency, but also save the circuit area and can improve the drive performance at the same time.

Figure 18:
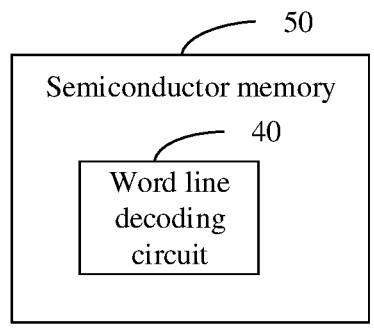
FIG. 18 is a structural schematic diagram of a semiconductor memory according to an embodiment of the disclosure.

In still another embodiment of the disclosure, referring to FIG. 18, which is a structural schematic diagram of a semiconductor memory 50 according to an embodiment of the disclosure. As shown in FIG. 18, the semiconductor memory 50 includes the word line decoding circuit 40 of any of the aforementioned embodiments.

In some embodiments, the semiconductor memory 50 may be a DRAM.

In the embodiment of the disclosure, since the semiconductor memory 50 includes a word line decoding circuit 40, two-stage amplification is performed on the decoding input signal according to the drive control signal, which can not only improve the circuit efficiency, but also save the circuit area and can improve the performance of the DRAM at the same time.

In some embodiments, the semiconductor memory 50 is a DRAM, and the specification of the DRAM conforms to DDR4 or DDR5.

The foregoing descriptions are only preferred embodiments of the disclosure and are not intended to limit the scope of protection of the disclosure. It is to be noted that terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Without further restrictions, the element defined by the statement "including a . . . " does not exclude the existence of another same element in the process, method, article or device including the element. The sequence numbers of the embodiments of the disclosure are adopted not to represent superiority-inferiority of the embodiments but only for description. The methods disclosed in several method embodiments provided in the present disclosure may be arbitrarily combined without conflict to obtain a new method embodiment. The characteristics disclosed in a plurality of product embodiments provided in the present disclosure may be arbitrarily combined without conflict to obtain a new product embodiment. The characteristics disclosed in the several method or device embodiments provided in the present disclosure may be arbitrarily combined without conflict to obtain a new method embodiment or device embodiment. The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

The embodiments of the disclosure provide a decoding drive circuit and a method therefor, a word line decoding circuit and a semiconductor memory. The decoding drive circuit includes at least one decoding driver. The decoding driver includes a first-stage drive circuit and a second-stage drive circuit. Herein, the first-stage drive circuit is configured to receive an enabling control signal, a decoding input signal and a drive control signal, and generate a first drive signal and a second drive signal according to the enabling control signal, the drive control signal and the decoding input signal. The second-stage drive circuit is configured to generate a target word line drive signal according to the first drive signal and the second drive signal. Thus, the embodiments of the disclosure provide a new decoding drive circuit, which can not only improve the circuit efficiency, but also save the circuit area and can improve the performance of the DRAM at the same time.

What is claimed is:

1. A decoding drive circuit, the decoding drive circuit comprising at least one decoding driver, the decoding driver comprising a first-stage drive circuit and a second-stage drive circuit, wherein the first-stage drive circuit is configured to receive an enabling control signal, a decoding input signal and a drive control signal, and generate a first drive signal and a second drive signal according to the enabling control signal, the drive control signal and the decoding input signal, wherein the second-stage drive circuit is configured to generate a target word line drive signal according to the first drive signal and the second drive signal;

wherein a first end of the first switch transistor is connected to an output end of the first-stage drive circuit for receiving the first drive signal; a first end of the second switch transistor is connected to other output end of the first-stage drive circuit for receiving the second drive signal;

a second end of the first switch transistor is connected to a first power supply terminal, and a second end of the second switch transistor is connected to a grounding terminal; and a third end of the first switch transistor is connected to a third end of the second switch transistor for outputting the target word line drive signal;

wherein the decoding drive circuit further comprises an enabling control circuit, an output end of the enabling control circuit is connected to an input end of the first-stage drive circuit, wherein the enabling control circuit is configured to generate the enabling control signal according to the drive control signal;

wherein the drive control signal comprises a first drive control signal and a second drive control signal, the first-stage drive circuit comprises a first control circuit and a second control circuit, wherein the first control circuit is configured to perform drive control on the decoding input signal according to the first drive control signal and the enabling control signal to generate the first drive signal, wherein the second control circuit is configured to perform drive control on the decoding input signal according to the first drive control signal, the second drive control signal and the enabling control signal to generate the second drive signal, wherein a level state of the first drive control signal is different from a level state of the second drive control signal.

2. The decoding drive circuit of claim 1, wherein the second-stage drive circuit comprises a first switch transistor and a second switch transistor, wherein the second-stage drive circuit is specifically configured to control operating state of the first switch transistor according to the first drive signal and control operating state of the second switch transistor according to the second drive signal, and generate the target word line drive signal according to the operating state of the first switch transistor and the operating state of the second switch transistor.

3. The decoding drive circuit of claim 2, wherein
the second-stage drive circuit is specifically configured to control the target word line drive signal to be in a first level state when the first switch transistor is in a turn-on state and the second switch transistor is in a turn-off state; or
the second-stage drive circuit is specifically configured to control the target word line drive signal to be in a second level state when the first switch transistor is in the turn-off state and the second switch transistor is in the turn-on state; or
the second-stage drive circuit is specifically configured to control the target word line drive signal to be in a third level state when the first switch transistor is in the turn-off state and the second switch transistor is in the turn-off state.

4. The decoding drive circuit of claim 3, wherein the first level state is a high level state, the second level state is a low level state, and the third level state is a Floating state.

5. The decoding drive circuit of claim 1, wherein the enabling control circuit comprises a third switch transistor, the first control circuit comprises a fourth switch transistor, a fifth switch transistor and a sixth switch transistor,
wherein a first end of the third switch transistor and a first end of the fourth switch transistor receive the first drive control signal, a first end of the fifth switch transistor and a first end of the sixth switch transistor receives the decoding input signal,
a third end of the fourth switch transistor, a third end of the fifth switch transistor and a third end of the sixth switch transistor are all connected to an output end of the first-stage drive circuit for outputting the first drive signal, and
a third end of the third switch transistor is connected to a second end of the sixth switch transistor, a second end of the third switch transistor is connected to a grounding terminal, a second end of the fourth switch transistor is connected to a second power supply terminal, and a second end of the fifth switch transistor is connected to a third power supply terminal.

6. The decoding drive circuit of claim 5, wherein the enabling control circuit further comprises a seventh switch transistor and an eighth switch transistor, the second control circuit comprises a ninth switch transistor, a tenth switch transistor, an eleventh switch transistor and a twelfth switch transistor,
wherein a first end of the seventh switch transistor and a first end of the twelfth switch transistor receive the first drive control signal, a first end of the eighth switch transistor and a first end of the ninth switch transistor receive the second drive control signal, a first end of the tenth switch transistor and a first end of the eleventh switch transistor receive the decoding input signal,
a third end of the ninth switch transistor, a third end of the tenth switch transistor, a third end of the eleventh switch transistor and a third end of the twelfth switch transistor are all connected to other output end of the second-stage drive circuit for outputting the second drive signal,
a third end of the eighth switch transistor, a second end of the tenth switch transistor is connected to a second end of the twelfth switch transistor, a third end of the seventh switch transistor is connected to a second end of the eleventh switch transistor, a second end of the seventh switch transistor is connected to the grounding terminal, a second end of the eighth switch transistor is connected to a fourth power supply terminal, and a second end of the ninth switch transistor is connected to the grounding terminal.

7. The decoding drive circuit of claim 6, wherein types of the first switch transistor, the second switch transistor, the third switch transistor, the fourth switch transistor, the fifth switch transistor, the sixth switch transistor, the seventh switch transistor, the eighth switch transistor, the ninth switch transistor, the tenth switch transistor, the eleventh switch transistor and the twelfth switch transistor are Metal-Oxide-Semiconductor Field-Effect Transistors (MOSFETs),
wherein a first end of the MOSFET is a gate, a second end of the MOSFET is a source, and a third end of the MOSFET is a drain.

8. The decoding drive circuit of claim 7, wherein
types of the first switch transistor, the fourth switch transistor, the fifth switch transistor, the eighth switch transistor, the tenth switch transistor and the twelfth switch transistor are P-type channel MOSFETS,
wherein types of the first switch transistor, the third switch transistor, the sixth switch transistor, the seventh switch transistor, the ninth switch transistor and the eleventh switch transistor are N-type channel MOSFETs.

9. A method for decoding drive, applied to a decoding drive circuit, the decoding drive circuit comprising at least one decoding driver, the decoding driver comprising a first-stage drive circuit and a second-stage drive circuit, wherein the method comprises:
receiving, by the first-stage drive circuit, an enabling control signal, a decoding input signal and a drive control signal, and generating a first drive signal and a second drive signal according to the enabling control signal, the drive control signal and the decoding input signal; and receiving, by the second-stage drive circuit, the first drive signal and the second drive signal, and generating a target word line drive signal according to the first drive signal and the second drive signal;

wherein the decoding drive circuit further comprises an enabling control circuit, wherein the method further comprises:

generating, by the enabling control circuit, the enabling control signal according to the drive control signal;

wherein the drive control signal comprises a first drive control signal and a second drive control signal, the first-stage drive circuit comprising a first control circuit and a second control circuit, wherein receiving an enabling control signal, a decoding input signal and a drive control signal through a first-stage drive circuit, and generating a first drive signal and a second drive signal according to the enabling control signal, the drive control signal and the decoding input signal comprises:

receiving the first drive control signal, the enabling control signal and the decoding input signal through the first control circuit, and performing drive control on the decoding input signal according to the first drive control signal and the enabling control signal to generate the first drive signal; and receiving the first drive control signal, the second drive control signal, the enabling control signal and the decoding input signal through the second control circuit, and performing drive control on the decoding input signal according to the first drive control signal, the second drive control signal and the enabling control signal to generate the second drive signal, wherein a level state of the first drive control signal is different from a level state of the second drive control signal.

10. The method for decoding drive of claim 9, wherein the second-stage drive circuit comprises a first switch transistor and a second switch transistor, wherein generating a target word line drive signal according to the first drive signal and the second drive signal comprises:

controlling the operating state of the first switch transistor according to the first drive signal;

controlling the operating state of the second switch transistor according to the second drive signal; and generating the target word line drive signal according to the operating state of the first switch transistor and the operating state of the second switch transistor.

11. The method for decoding drive of claim 10, wherein generating the target word line drive signal according to the operating state of the first switch transistor and the operating state of the second switch transistor comprises:

controlling the target word line drive signal to be in a first level state when the first switch transistor is in a turn-on state and the second switch transistor is in a turn-off state; or controlling the target word line drive signal to be in a second level state when the first switch transistor is in the turn-off state and the second switch transistor is in the turn-on state; or controlling the target word line drive signal to be in a third level state when the first switch transistor is in the turn-off state and the second switch transistor is in the turn-off state.

12. The method for decoding drive of claim 11, wherein the first level state is a high level state, the second level state being a low level state, and the third level state being a Floating state.

13. The method for decoding drive of claim 12, wherein the level state of the target word line comprises a high level state, a low level state and a Floating state, wherein a level state of the target word line is correlated with the target word line drive signal.

14. A word line decoding circuit comprising a word line drive circuit, an inverted main word line drive circuit and a local decoding drive circuit, wherein the word line drive circuit at least comprises a decoding drive circuit, the decoding drive circuit comprises at least one decoding driver, the decoding driver comprising a first-stage drive circuit and a second-stage drive circuit, wherein the first-stage drive circuit is configured to receive an enabling control signal, a decoding input signal and a drive control signal, and generate a first drive signal and a second drive signal according to the enabling control signal, the drive control signal and the decoding input signal, wherein the second-stage drive circuit is configured to generate a target word line drive signal according to the first drive signal and the second drive signal;

wherein a first end of the first switch transistor is connected to an output end of the first-stage drive circuit for receiving the first drive signal; a first end of the second switch transistor is connected to other output end of the first-stage drive circuit for receiving the second drive signal;

a second end of the first switch transistor is connected to a first power supply terminal, and a second end of the second switch transistor is connected to a grounding terminal; and a third end of the first switch transistor is connected to a third end of the second switch transistor for outputting the target word line drive signal;

wherein the decoding drive circuit further comprises an enabling control circuit, an output end of the enabling control circuit is connected to an input end of the first-stage drive circuit, wherein the enabling control circuit is configured to generate the enabling control signal according to the drive control signal;

wherein the drive control signal comprises a first drive control signal and a second drive control signal, the first-stage drive circuit comprises a first control circuit and a second control circuit, wherein the first control circuit is configured to perform drive control on the decoding input signal according to the first drive control signal and the enabling control signal to generate the first drive signal, wherein the second control circuit is configured to perform drive control on the decoding input signal according to the first drive control signal, the second drive control signal and the enabling control signal to generate the second drive signal, wherein a level state of the first drive control signal is different from a level state of the second drive control signal.

15. A semiconductor memory comprising the word line decoding circuit of claim 14.

* * * * *